(12) United States Patent
Despont et al.

(10) Patent No.: US 9,070,578 B2
(45) Date of Patent: Jun. 30, 2015

(54) ELECTROMECHANICAL SWITCHING DEVICE WITH 2D LAYERED MATERIAL SURFACES

(71) Applicant: International Business Machines Corporation, Armonk, NY (US)

(72) Inventors: Michel Despont, Cheseaux-Noreaz (CH); Urs T. Duerig, Rueschlikon (CH); Daniel Grogg, Ruschlikon (CH); Armin W. Knoll, Adliswil (CH); Elad Koren, Wadenswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/449,177

(22) Filed: Aug. 1, 2014

(65) Prior Publication Data

US 2015/0069472 A1    Mar. 12, 2015

(30) Foreign Application Priority Data

Sep. 12, 2013    (GB) .................................. 1316262.3

(51) Int. Cl.
*B81B 3/00*        (2006.01)
*H01L 27/092*   (2006.01)
(Continued)

(52) U.S. Cl.
CPC ............ *H01L 27/092* (2013.01); *B81B 3/0021* (2013.01); *B81B 2201/01* (2013.01); *B81B 7/008* (2013.01); *B81B 1/006* (2013.01)

(58) Field of Classification Search
CPC .. H01H 59/0009; H01H 51/22; B81B 3/0021; B81B 3/0037; B81B 7/008; B81C 1/00341; H01L 29/792; H01L 27/092

USPC .................................................. 257/414–416
See application file for complete search history.

(56) References Cited

U.S. PATENT DOCUMENTS

| 7,071,023 | B2 | 7/2006 | Bertin et al. |
| 7,432,571 | B2 * | 10/2008 | Lee et al. ...................... 257/414 |
| 7,612,424 | B1 | 11/2009 | Espinosa et al. |
| 7,723,810 | B2 * | 5/2010 | Miller et al. .................. 257/414 |

(Continued)

FOREIGN PATENT DOCUMENTS

| CN | 101993035 A | 3/2011 |
| EP | 1155237 B1 | 4/2004 |
| WO | 02090246 A2 | 11/2002 |

(Continued)

OTHER PUBLICATIONS

GB Application 1316262.3, entitled: "Electromechanical Switching Device With 2D Layered Material Surfaces", filed Sep. 12, 2013.

(Continued)

*Primary Examiner* — Nathan Ha
(74) *Attorney, Agent, or Firm* — Vazken A. Alexanian; L. Jeffrey Kelly (57) ABSTRACT

The present invention is notably directed to an electromechanical switching device having: two electrodes, including: a first electrode, having layers of a first 2D layered material, which layers exhibit a first surface; and a second electrode, having layers of a second 2D layered material, which layers exhibit a second surface vis-à-vis said first surface; and an actuation mechanism, where: each of the first and second 2D layered materials is electrically conducting; and at least one of said two electrodes is actuatable by the actuation mechanism to modify a distance between the first surface and the second surface, such as to modify an electrical conductivity transverse to each of the first surface and the second surface and thereby enable current modulation between the first electrode and the second electrode.

15 Claims, 9 Drawing Sheets (51) Int. Cl.
*B81B 7/00* (2006.01)
*B81B 1/00* (2006.01)

(56) References Cited

U.S. PATENT DOCUMENTS

| | | | |
|---|---|---|---|
| 7,759,591 B2 * | 7/2010 | Kim et al. | 200/181 |
| 7,798,822 B2 * | 9/2010 | Eldridge et al. | 439/81 |
| 7,833,484 B2 * | 11/2010 | Gueissaz et al. | 422/402 |
| 8,258,899 B2 | 9/2012 | Feng et al. | |
| 2006/0086994 A1 | 4/2006 | Viefers et al. | |
| 2009/0020399 A1 | 1/2009 | Kim et al. | |
| 2011/0101309 A1 | 5/2011 | Lin et al. | |
| 2015/0014796 A1 * | 1/2015 | Dehe | 257/416 |

FOREIGN PATENT DOCUMENTS

| | | | |
|---|---|---|---|
| WO | 2009080375 A1 | 7/2009 | |
| WO | 2013029094 A1 | 3/2013 | |

OTHER PUBLICATIONS

Grogg et al., "Curved in-plane electromechanical relay for low power logic applications", Journal of Micromechanics and Microengineering, J. Micromech. Microeng. vol. 23, 2013, pp. 1-8.

Peres et al., "Focus on graphene", New Journal of Physics vol. 11, 2009, pp. 1-5.

Knoll et al., "Fundamental scaling properties of electro-mechanical switches", New Journal of Physics vol. 14, 2012, pp. 1-18.

Standley et al., "Graphene-Based Atomic-Scale Switches", Nano Letters, 2008, vol. 8, No. 10, pp. 3345-3349.

Li et al., "Graphene fixed-end beam arrays based on mechanical exfoliation", Applied Physics Letters, vol. 98, 2011, pp. 253105-1-253105-3.

"Cleaning up water", Nature Materials, vol. 7, No. 5, May 2008, www.nature.com/naturematerials, p. 341.

Shi et al., "Studies of Graphene-Based Nanoelectromechanical Switches", Nano Research, 2012, vol. 5, No. 2, pp. 82-87.

Paulson et al., "Tunable Resistance of a Carbon Nanotube—Graphite Interface", Science, Dec. 1, 2000 vol. 290, www.sciencemag.org, pp. 1742-1744.

Koch et al., "Voltage-dependent conductance of a single graphene nanoribbon", Nature Nanotechnology, Letters, vol. 7, Nov. 2012, www.nature.com/naturenanotechnology, Published Online: Oct. 14, 2012, pp. 713-717.

GB Search report for application No. 1316262.3, Search date Mar. 5, 2014.

* cited by examiner

ELECTROMECHANICAL SWITCHING DEVICE WITH 2D LAYERED MATERIAL SURFACES

BACKGROUND

The invention relates in general to the field of electromechanical switching devices, more specifically to micro-electromechanical and nano-electromechanical switching devices.

As power and energy constraints in microelectronic applications become more and more challenging one is constantly seeking alternative and more power efficient ways of switching and computing. A conventional switching device used in the semiconductor industry is a CMOS transistor. To overcome power related power bottlenecks in CMOS devices switching devices which operate on fundamentally different transport mechanisms such as tunneling are investigated. However, combining the desirable characteristics of high on-current, very low off-current, abrupt switching, high speed as well as a small footprint in a device that might be easily interfaced to a CMOS device is a challenging task. Mechanical switches such as nano-electromechanical switches (NEM switches) are promising devices to meet these kinds of criteria. A nano-electromechanical switch having a narrow gap between electrodes is controlled by electrostatic actuation. In response to an electrostatic force a contact electrode can be bent or actuated to contact another electrode thus closing the switch.

SUMMARY

According to one embodiment of the present invention, an electromechanical switching device with 2D layered material surfaces is provided. The structure may include a first electrode having a first 2D layered material with a first surface, and the first 2D layered material is electrically conducting; a second electrode having a second 2D layered material with a second surface, wherein the second surface is opposite the first surface, a distance separates the first surface from the second surface, and the second 2D layered material is electrically conducting; an actuation mechanism, wherein at least one of the two electrodes is actuatable by the actuation mechanism changing the distance between the first surface and the second surface, the change in distance modifies the electrical conductivity transverse to each of the first surface and the second surface thereby enabling current modulation between the first electrode and the second electrode.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 9-17: schematically illustrates electromechanical switching devices using a parallel actuation mechanism, according to other embodiments of the invention.

FIGS. 9-10 generally illustrate how the axial position of electrodes can be moved, such as to modify an axial overlap between electrodes of an electromechanical switching device.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring generally to FIGS. 1-17, an embodiment is first described, which concerns an electromechanical switching device 100. The device 100 comprises an actuation mechanism 13, 19 for actuating opposite electrodes that are covered with electrically conducting 2*d* layered materials. The opposite electrodes include a first electrode group and a second electrode group. The first electrode group comprises a first electrode 11, layers of a first 2D layered material 21, and has a first surface S1. The first 2D layered material 21 is on the first electrode 11. The second electrode group comprises a second electrode 12, layers of a second 2D layered material 22, and has a second surface S2 vis-à-vis the first surface S1. The second 2D layered material 22 is on the second electrode 12. The first 2D layered material 21 and the second 2D layered material 22 are each electrically conducting.

Several types of designs can be contemplated for the actuation mechanism 13, 19 but most generally, this mechanism is coupled to one or each of the electrodes and configured to actuate the coupled electrode(s), such as to modify a distance d between the first and second surfaces S1, S2. This, in turn, modifies the electrical conductivity transverse between the first surface S1 and the second surface S2, thereby enabling current modulation between the first electrode 11 and the second electrode 12.

The proposed design enables low-friction/stiction movements, such as, for example, rotation, translation, or other movement of any mechanical piece located opposite the electrodes. Namely, opposite parts that are movable relatively to each other as per actuation by the actuation device comprise layers of a 2D layered material: the exposed surfaces of the layered materials can be actuated to be brought in vis-à-vis, and preferably are parallel.

Changing the distance d may be carried out transversely and/or parallel to the first and second surfaces S1, S2, as explained below in reference to two classes of embodiments. Accordingly, the distance d that is modified may be a transverse distance (for transverse actuation) and/or a parallel distance (for parallel actuation) between first and second surfaces S1 and S2.

The transverse distance between electrodes will typically be close to a transverse equilibrium distance between a first layered material and the second layered material. Typically, for transverse actuation embodiments: an inter-electrode gap 25 will be larger than the transverse equilibrium distance in an "off" state of the device. In an "on" state, the inter-electrode gap 25 will be smaller than or equal to the transverse equilibrium distance. In fact, what is needed is to ensure a sufficient difference of inter-electrode gap 25 between the "on" and "off" states, as the transverse conductivity depends (roughly) exponentially on the transverse distance. Optimal distances can be determined by trial-and-error. In parallel actuation embodiments, one needs to operate electrodes at a sufficiently close transverse distance, ideally equal to the equilibrium distance, but possibly slightly smaller or larger, as long as a satisfactory on/off ratio is obtained. For parallel actuation, the transverse distance needs not be changed, in principle. For example, in the "off" state a typical gap between the two electrodes is close to 3.5 Å for Graphitic layers.

In the first class of embodiments, the movable electrode is typically a drain opposite a source electrode, where transverse current modulation applies. In the second class, the movable electrode is distinct from the drain and source electrodes and opposite thereto, such as, for example, pivotably mounted in the device, to enable current modulation between the drain and source electrodes via the movable electrode.

The number of layers of the 2D layered materials involved is larger than or equal to 1 and typically smaller than $10^7$. But in most cases, a few layers (less than or equal to 10) may suffice. The actual number of layers to use will depend on the type of switch needed, the electrical, mechanical, and chemical properties of the 2D layered materials. The proposed current modulation schemes discussed here require at least one layer of a 2D layered material on each of the electrodes.

The 2D layered materials are known and largely addressed in the scientific literature. While graphene is the most well-known 2D layered material, other materials, can be contemplated for use in the present embodiment. In an embodiment, the device 100 may involve one or more of the following 2D layered materials (not just for the electrodes): graphene, graphitic layers, BN, $MoS_2$, $WS_2$, $MoSe_2$, $NbSe_2$, $NbS_2$, $NbTe_2$, $TaS_2$, $TaSe_2$, $TaTe_2$ and/or $TiSe_2$. 2D layered materials can be formed either by Chemical Vapor Deposition (or CVD) growth or by mechanical exfoliation directly on a substrate or by transferring a pre-existing material on to the substrate from a different substrate that was used for the material growth (when the 2D layered material cannot be grown directly on the desired substrate, such as, for example, $SiO_2$). The number of layers needed can typically be the same as for graphene.

The thicknesses and lateral dimensions of the electrodes (gate, source, drain), or moving parts involved, typically range from a few nanometers (at least 1 nm) to a few microns, typically less than 20 µm (preferably less than 100 µm). The thickness of the 2D layered materials used in embodiments below can vary from a single layer (less than 1 nm) to hundreds of layers (more than 100 nm), but will typically be in the nanometer range. The "contact" area between the electrodes is typically between 50 nm and 1 micron (1000 nm). Thus, preferred embodiments of the present electromechanical switching devices can be regarded as micro- or nano-switching devices. The contact area size determines the "on" current, a thing that can be adapted as needed, depending on the actual application contemplated.

At least some of the embodiments discussed below allow for achieving an on/off ratio that is greater than $10^3$, assuming that a conducting/semiconducting 2D material is used for the electrodes. This ratio will depend on the fundamental properties of the chosen materials. Note that some of the 2D layered materials listed above can be used as conducting elements while others can be used as insulating elements, depending on whether they are used for electrical modulation and/or to reduce friction and stiction between opposite mechanical parts.

Most devices described below can be obtained by standard fabrication processes, such as, for example, by photo or E-beam Lithography. A few layers of graphene or other 2D layered materials may, for instance, be deposited on top of a bottom electrode, followed by a mask deposition on top of the deposited 2D material layers. The top electrode can then be deposited on top of the 2D material layers, followed by lift off and etch steps.

In an embodiment, the first electrode 11 is a drain electrode and the second electrode 12 is a source electrode. The actuation mechanism 13, 19 is an electromechanical actuation mechanism that additionally comprises a gate electrode 13. The latter is configured with respect to the actuatable electrode(s) to enable actuation thereof. An electromechanical actuation device is perhaps the simpler type of mechanism to implement in the present context. The energy required is low, notably due to the low surface energy of the 2D layered materials.

Such an electromechanical mechanism is based on electrostatic actuation. A potential is applied between the drain and the source. As a result, the coupling/length between the overlying layered materials is changed. This results in a current modulation between the source and the drain.

FIGS. 1-8 illustrate transverse actuation mechanisms. Namely, the actuation mechanism is actuatable to modify the transverse distance, that is, the transverse distance between the first and second surfaces S1 and S2. The surfaces S1, S2 are preferably parallel. Transverse actuation mechanisms as illustrated in FIGS. 1-8 are particularly simple to fabricate compared to devices such as depicted in FIGS. 9-17. It should be noted there is an intercalated material 40 present in FIG. 8.

Figure 3:
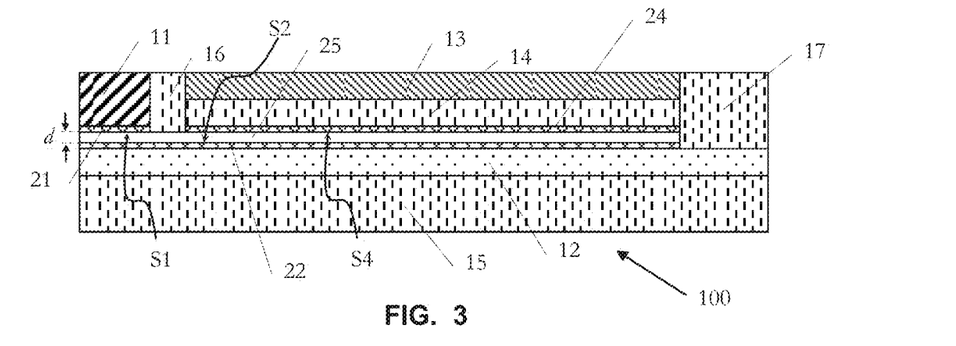
Figure 4:
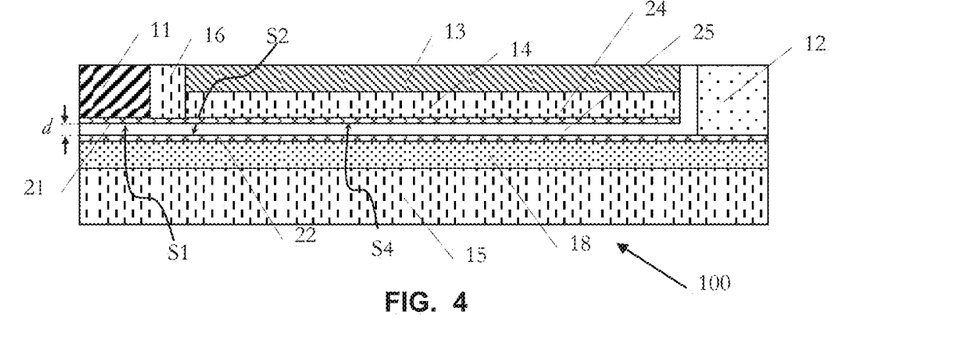

FIGS. 3-6 illustrate devices 100 relying on an electromechanical mechanism. In FIGS. 3 and 4, the first electrode 11 (drain) (and all elements integral therewith) is the actuated part, whereas in FIGS. 5 and 6, the moving part is the second electrode 12 (source).

In FIG. 3, the gate 13 extends parallel to the source. The drain is covered with the first 2D layered material 21, exhibiting a first surface S1 opposite to the second surface S2. The gate 13 is covered by a first additional layer 14 (e.g., insulating), itself covered with another 2D material 24, exhibiting a fourth surface S4, oppositely to the second surface S2. The various 2D layered materials provided in this arrangement reduce stiction an ease the electrical and/or mechanical contact between opposite mechanical parts. FIG. 3 shows additional insulating elements, a first insulating element 16 and a second insulating element 17, the first insulating element 16 arranged between the drain and the gate 13 (and not covered by a 2D layered material), and the second insulating element 17 being provided on the other side of the gate 13. A second additional (e.g., insulating) layer 15 is provided underneath the source 12. Such an arrangement is particularly advantageous when the drain and source electrodes are required to be directed to the top and bottom of the sample, respectively.

In an alternative embodiment of FIG. 4, the source is provided in place of the second insulating element 17 of FIG. 3, the gate 13 extending parallel to a metallic or insulating layer 18. The source is covered by the second 2D layered material 22, which extends beyond the source to face an opposite layer 21, 24 covering a drain and gate side. The opposite layer 21, 24 is a continuous layer covering the drain, the first insulating element 16, and the first additional layer 14. Such an arrangement is particularly advantageous when the source and drain electrodes are required to be directed to the top of the sample. In addition, the surface below the gate electrode is used to increase the contact area between the source and the drain thus enabling to achieve higher "on" currents.

Figure 5:
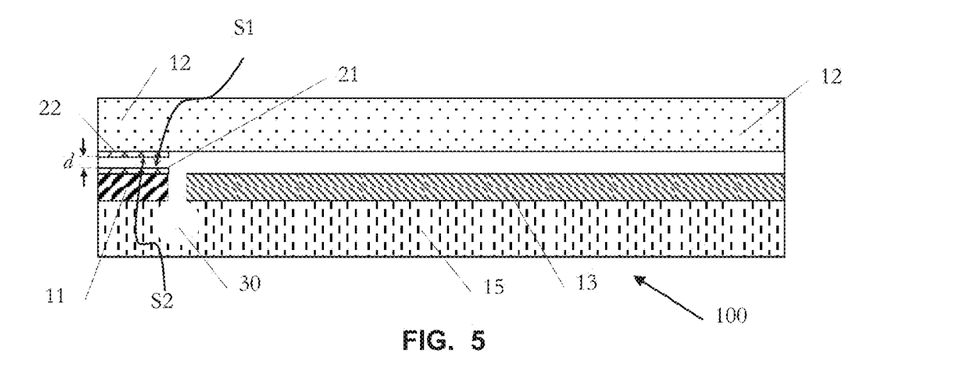
Figure 6:
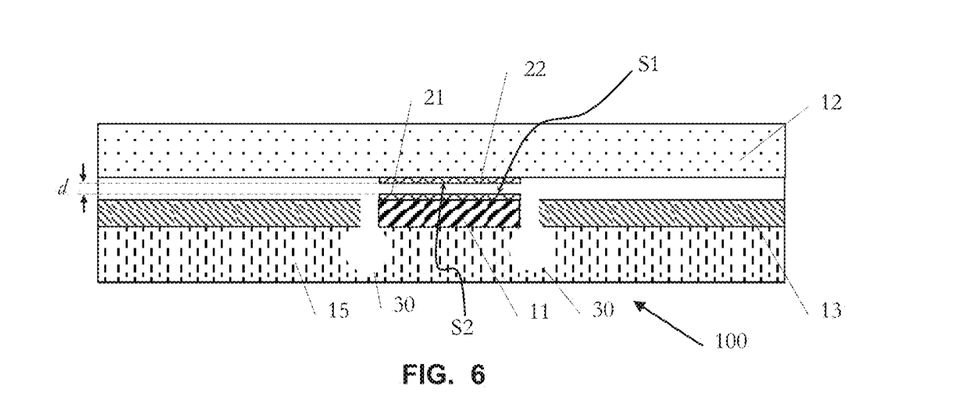

In FIG. 5, the source extends opposite and parallel to the gate 13. A trench 30 interrupts the gate 13. The drain is arranged opposite to the gate 13 with respect to the trench 30. The drain is covered with the first 2D layered material 21. A corresponding portion of the source is covered with the second 2D layered material 22. Such an arrangement is easy to fabricate when the 2D material is grown directly on conducting substrate. Also, this arrangement does not require a partial etch of the 2D material. The arrangement of FIG. 6 is similar to that of FIG. 5, except that the gate 13 surrounds the drain.

Figure 7:
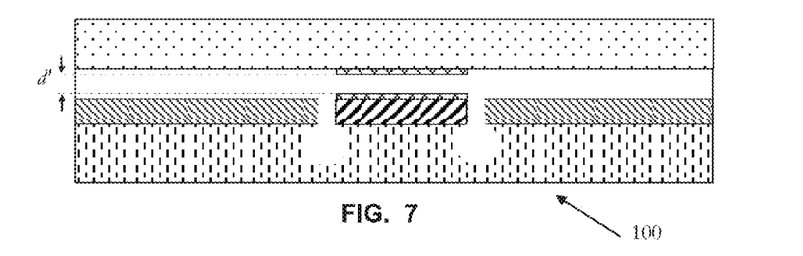
Figure 8:
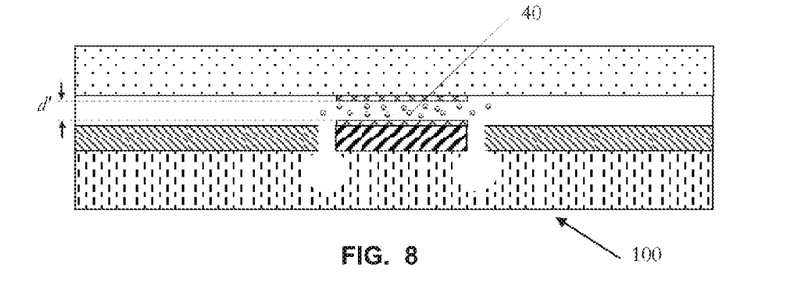

Variants may notably involve material stress to modulate the transverse distance, in addition to electrostatic actuation, e.g., to increase the transverse equilibrium distance to realize a higher "on/off" ratio. Also, a thermal deformation process may be involved to change the distance d into a second distance d' (or vice versa), as illustrated in FIGS. 6-7, in addition to electrostatic actuation. In other variants, material intercalation can be used to change the gap between the source and drain, as illustrated in FIG. 8. For example, a molecular-ions fluid (gas or liquid) can be inserted between the source and gate/drain to change the transverse distance. Material intercalation can be also used as a way to modulate the charge transport properties between the source and the drain (even without affecting the mutual distance), e.g., for switching applications and/or sensing applications.

Figure 1:
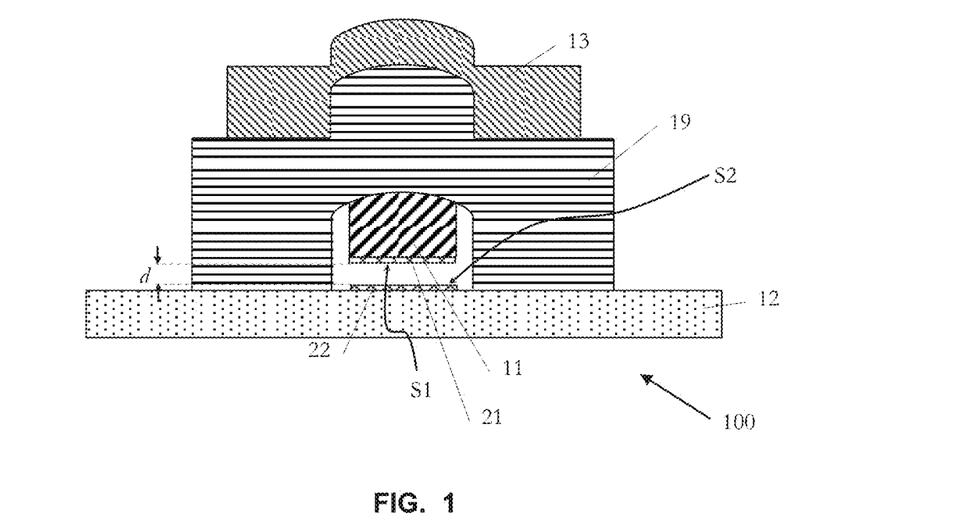
FIGS. 1-8: schematically illustrates electromechanical switching devices using a transverse actuation mechanism, according to embodiments of the invention.
Figure 2:
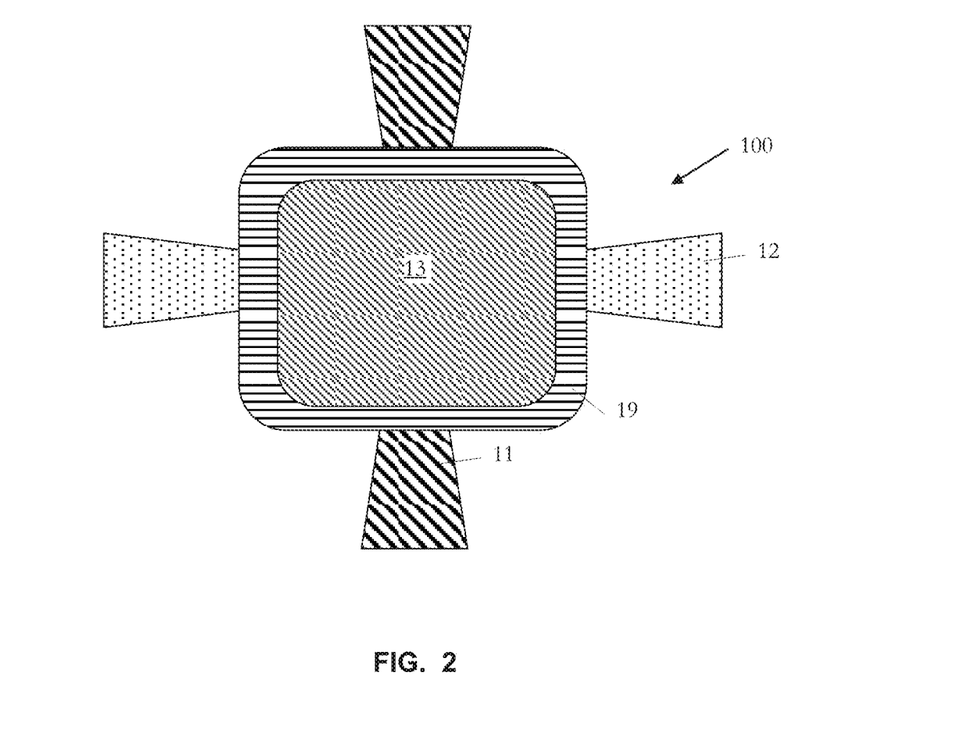

Still, other actuation mechanism can be contemplated, such as, for example, a magnetic device or a piezo-electric material may be used to change the gap. In this respect, FIGS. 1-2 show a side view and a top view of a device using a piezo-electric material 19 as part of the actuation mechanism 13, 19. Layers of 2D layered materials 21, 22 are provided on the drain and the source. The piezo-electric actuation actuates the drain, which results in changing the distance d, and as a result modulates the conductance between the source and the drain.

Reference is now made to FIGS. 9-17, which illustrate "parallel" actuation devices. In Such embodiments, the actuatable electrode(s) is (are) mounted movable, such as for surfaces S1, S2 to be movable parallel, relatively to each other. Actuation of the electrode(s) allows for modifying the overlap between the surfaces S1, S2.

Figure 9A:
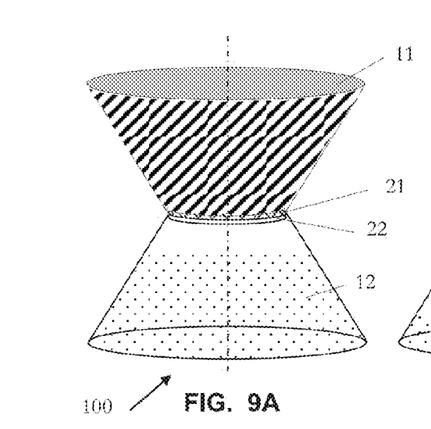
Figure 9B:
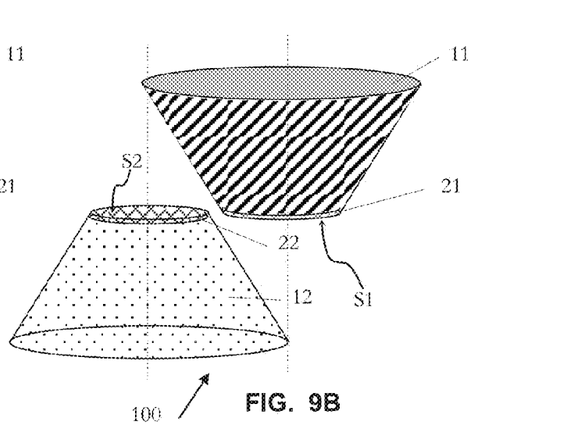

In the cases of FIGS. 9-10, this is the axial position of the electrodes that is changed, such as to modify the axial overlap between the surfaces S1, S2. The longitudinal axes of the electrodes can be moved from an eccentric to a concentric position (where the two axes of the conic electrode tips are aligned). As a result, the two surfaces S1, S2 of the electrodes pass from a non-overlapping (off) state to an overlapping (on) state. The effective distance between the surfaces is accordingly changed, even if the distance, i.e., the perpendicular distance between the respective subtending planes is not (or not substantially). In FIGS. 9-10, any one or both the upper and lower electrodes could be actuated by the actuation mechanism (not shown here for conciseness). More generally, the device 100 can be designed such as to modify the overlap between electrodes.

Such devices can, again, be realized thanks to standard process steps, such as, for example, using Photo or E-Beam Lithography.

Figures 10A, 10B:
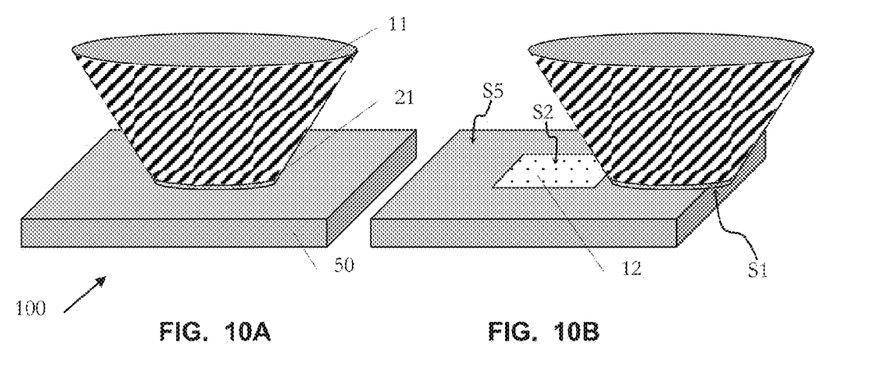

In reference to FIGS. 10A-10B: a variant to FIG. 9 is described, wherein a bottom electrode comprises an active surface that is embedded within an inactive surface, such as, for example, hexagonal boron nitride (h-BN). In fact, one understands that any or each of the two electrodes 11, 12 could be similarly configured. More in detail, such an electrode comprises an active region exhibiting the second surface S2, wherein the active region is embedded in an inactive region 50, which exhibiting an inactive surface S5. The inactive surface S5 is the surface of an insulating material such as hexagonal boron nitride or chemically modified two layer materials, such as, for example, graphane or graphene oxide, and surrounds the second surface S2, such that the second surface S2 is essentially level with the inactive surface S5.

Such variants have advantages in terms of stability and possibly in terms of friction, depending on the materials chosen. First, this allows for maintaining stability (height) of the sliding electrode, as opposed to sliding against air (as in FIG. 9) where maintaining stability is more difficult in the "off" state. Second, a suitable friction element e.g., hexagonal boron nitride or h-BN makes it possible to achieve low friction during the lateral motion in comparison with sliding against air, which is advantageous for low energy operation. In other words, such variants make it possible to maintain a constant height of the sliding electrode(s).

One currently knows mainly two ways of fabricating intermixtures (heterostructures) of different 2D materials. A first way is to grow the first layer over the whole substrate (several growing methods of Graphene and h-BN are known in the art), then to pattern the first layer by writing a mask and etch. Then the second layer can be grown selectively in the regions where the first layer was etched. A second way is to grow a partial layer of the first kind and then to continue with the growing of the second material by changing the gas atmosphere reacting gases inside the reactor.

Next, FIGS. 11-17 illustrate examples of parallel actuation mechanisms, wherein (and for illustration purposes), the second electrode 12 (connected to the source) is actuated the second electrode 12 has a beam 122 in this embodiment being an actuatable electrode 12, 22, 122. The actuatable electrode 12, 22, 122 can notably be flexibly, pivotably or rotatably mounted, or still, deformable upon actuation, such as for the surfaces S1, S2 to be slidably movable relatively to each other upon actuation. The actuation mechanism used to that aim typically is an electromechanical actuation mechanism. It may comprise the gate 13, configured with respect to the actuatable electrode 12, 22, 122 to respectively flex, pivot, rotate, and/or deform it, upon actuation by a actuation mechanism. Examples are discussed below. In other words, the actuatable electrode is movable in-plane, such as, for example, in-plane with the second surface S2 of the 2D material that covers the body of the actuatable electrode 12, 22, 122. Such a mechanism allows for implementing parallel actuation mechanisms as evoked earlier, and notably enables embodiment such as depicted in FIGS. 9-10.

FIGS. 11-14 schematically depict embodiments wherein the actuatable electrode 12, 22, 122 comprises the beam 122 and an anchor 124. The beam is flexibly and/or pivotably anchored at the anchor 124. The sliding part or pivot can be fabricated using standard process steps.

Figure 11:
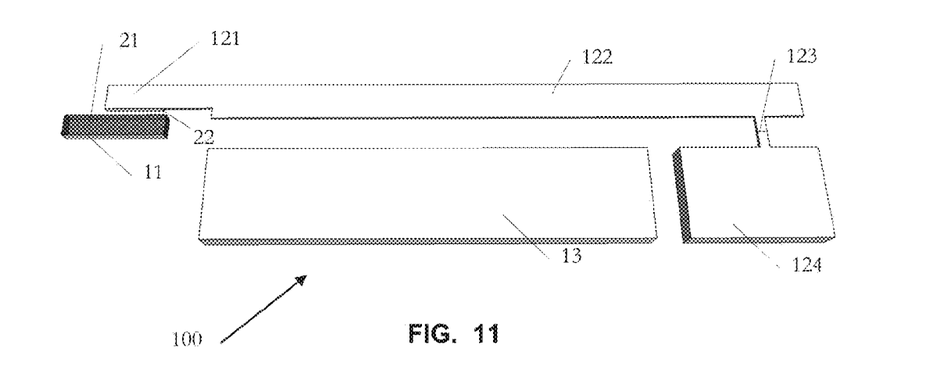
FIGS. 11-17: illustrate specific embodiments where an electrode is flexibly, pivotably or rotatably mounted, or still deformable upon actuation.
Figure 12:
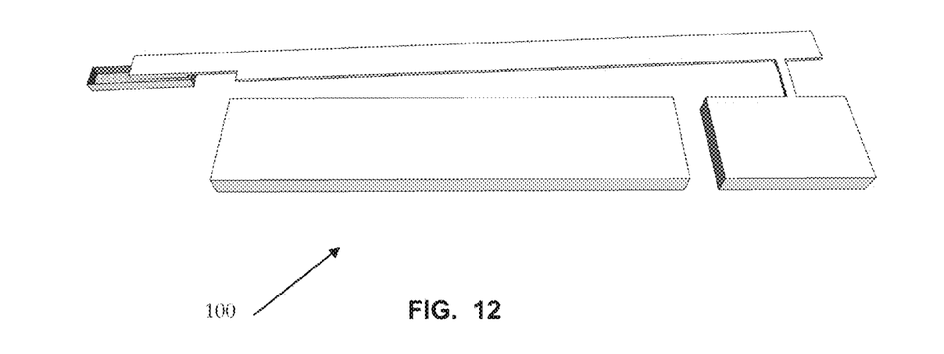

In FIGS. 11 and 12 the first electrode 11, 21 is a drain. The actuatable electrode 12, 22, 122 is connected to a source (anchor 124) and actuated via a gate electrode 123. The actuatable electrode 12, 22, 122 and the drain are arranged opposite to each other. The actuatable electrode 12, 22, 122 can flex or pivot at the level of a hinge (a living hinge) to contact the drain at the level of the end 121 (the opposite surface is not visible here), as depicted in FIG. 12 ("on" state). A normally "off" state is assumed (FIG. 11). However, a normally "on" state can be contemplated.

For instance, a suitable fabrication process may comprise:
Step 1: Mask deposition and writing on top of a few layers of Graphene (or another 2D layered material);
Step 2: Metal deposition;
Step 3: Lift off and Graphene etch/partial etch (if required);
Step 4: Deposition of a suspending layer, such as, for example, $SiO_2$, which will be removed later on by a buffered oxide etch, such as, for example, BHF;
Step 5: The top electrode can be opened by a brief etch (following an additional lithography step);
Step 6: Metal deposition follows;
Step 7: The device structure is defined by an etching step (following an additional lithography step);
Step 8: The beam is released by BHF.

The above process is mostly suited for the fabrication of the device depicted in FIG. 11. Devices according to other embodiments (FIGS. 12-17) can be fabricated by slightly adapting the above process, such as, for example, with the addition of another lithographic step.

Figure 13:
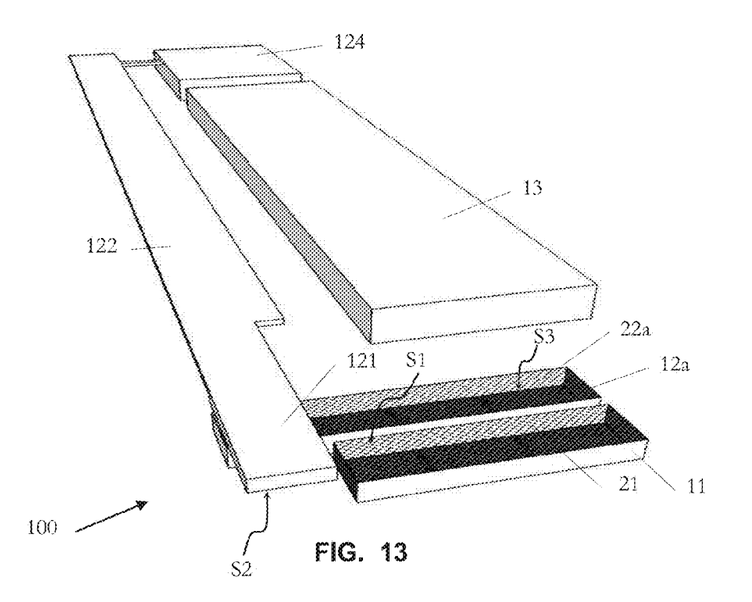
Figure 14:
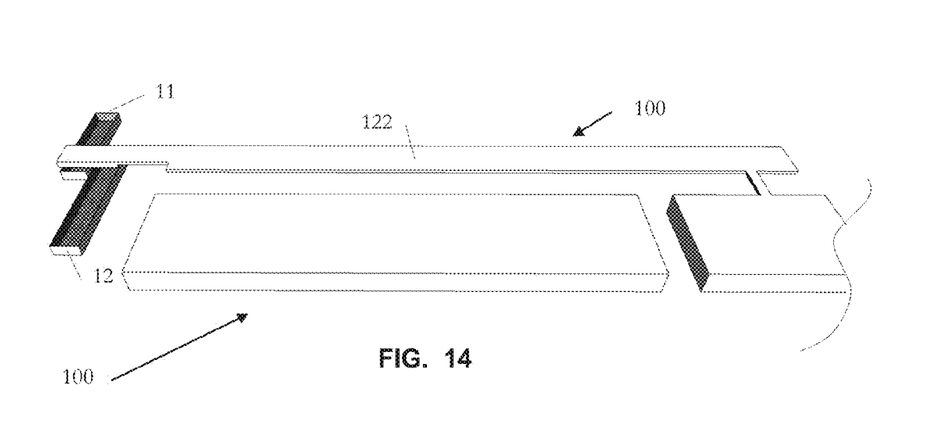

In FIGS. 13, 14: the first electrode 11 is a drain electrode and the device 100 further comprises a source electrode 12a, 22a distinct from the actuatable electrode 12, 22, 122. The source electrode 12a and the drain electrode are arranged side-by-side in the device 100 (they preferably extend parallel to each other). The source electrode 12a comprises a third layer 22a of a third 2D layered material that exhibits a third surface S3 vis-à-vis the second surface S2 and coplanar with the first surface S1. The second electrode 12 is actuatable by the actuation mechanism to modify an overlap between the second surface S2 and the first surface S1 of the drain electrode, while remaining in electrical contact with the source electrode 12a. Thus, it is possible to modify the electrical conductivity between the first surface S1 and the third surface S3 via the second surface S2. Again, normally "on" or "off" states can be contemplated, as respectively illustrated in FIGS. 13-14. This type of embodiments allows for improved height stability of the moving element during the "off" state, because the moving element is supported by a neighboring surface. In addition it allows for realizing both source 12a and drain electrodes as static electrodes, which is beneficial for some applications and in terms of fabrication.

Figure 15:
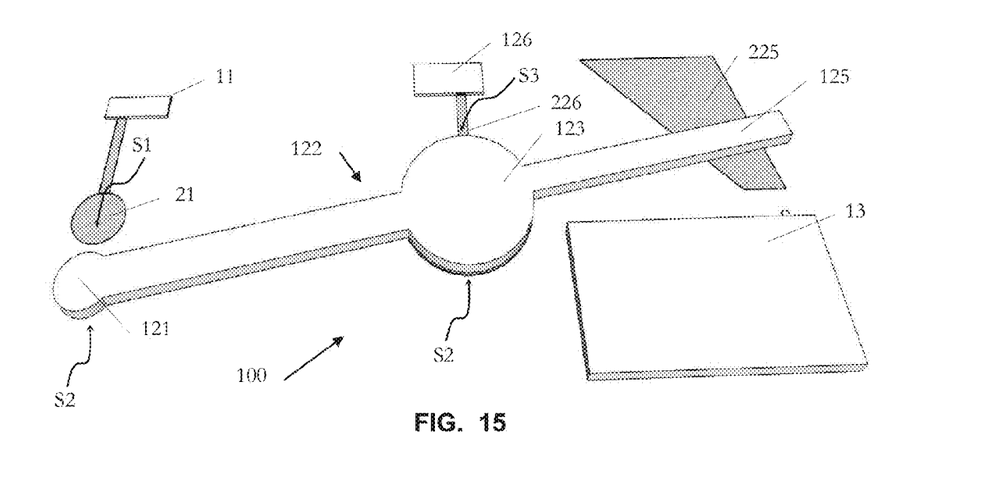
Figure 16:
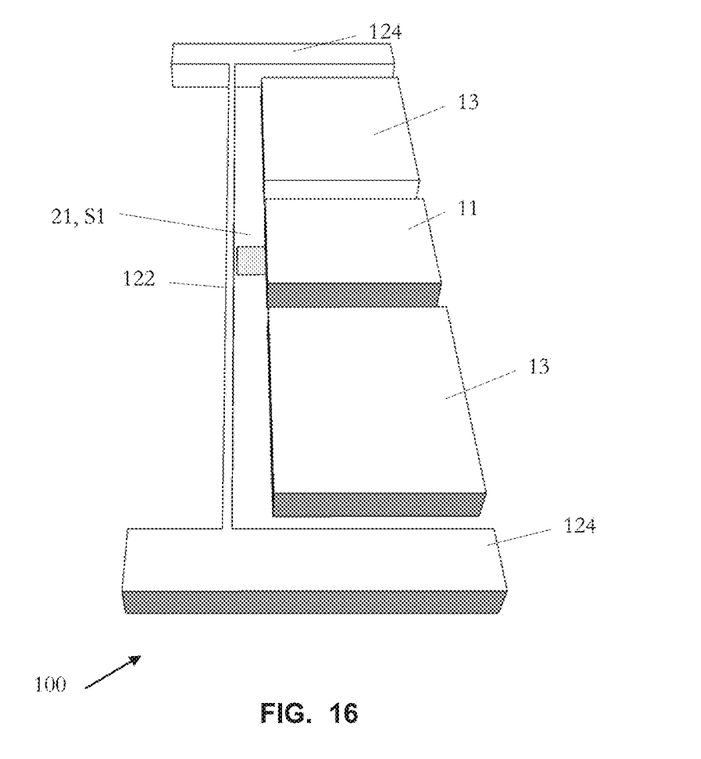
Figure 17:
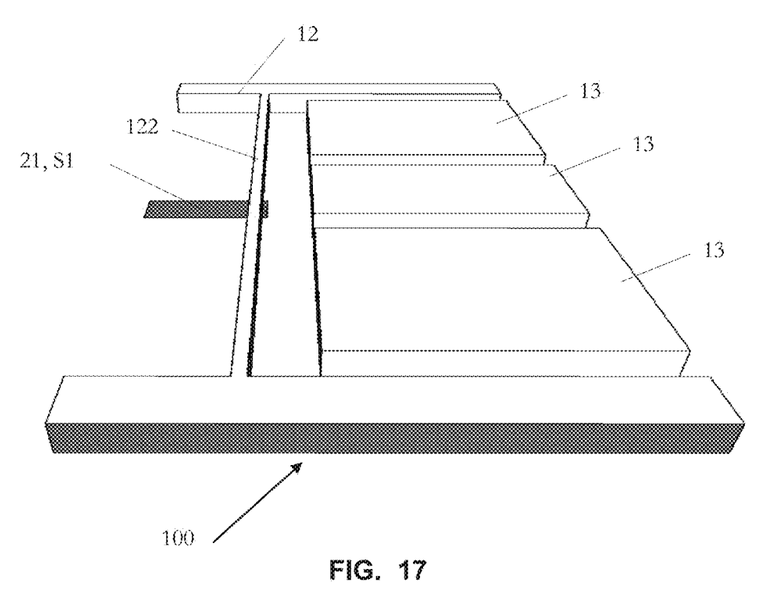

FIGS. 16-17 depict devices wherein the electrode comprises the beam 122 and two anchors 124 on each side of the beam 122: the beam is anchored at each of the anchors 124 and deformable upon actuation by the gate 13. The electrode is preferably coupled as a source electrode in the device 100. FIGS. 16 and 17 correspond to normally "off" and normally "on" implementations, respectively. Such implementations are variants to FIGS. 13, 14, which allows for better stabilizing the height of the beam 122. Yet, a drawback of such variants is that it requires either increased power or longer beams to enable the bending of the beam 122. Therefore, another variant is proposed in FIG. 15.

In FIG. 15, the second electrode again consists of a beam 122 rotatably mounted in the device 100, such as to exhibit two parts 121, 125, each extending from an axis 123 about which the beam 122 is rotatable. One part 125 is arranged in proximity of the gate electrode 13 for it to be actuatable by the gate electrode 13. The other part 121 comprises layers of the second 2D layered material 22 opposite a second blade 125. The blade having a fifth 2d layered material 225. There is another 2D layered material 226 connected to a pad 126. In this way, an ultra low energy actuation operation can be realized, e.g., wherein the actuation voltage is lower than 1 V in the range of 0.01-1 V.

Most of the depicted embodiments rely on an electrostatic actuation mechanism. However, variants of the present embodiments may comprise one or any combination of: an electrostatic mechanism; a piezoelectric mechanism; a thermal deformation mechanism; a material stress mechanism or a magnetic mechanism. In each case, a mechanical deformation/motion of one or more of the electrodes can be achieved, in a similar fashion as in FIGS. 1-17, to modify the distance between surfaces S1 and S2. This, in turn, modifies the electrical conductivity transverse to each surface S1, S2 and thereby enables current modulation between respective electrodes. For example: the electrostatic force between two electrodes can induce mechanical motion if one or both electrodes are movable in the applied force range. The piezo element 19 can be integrated to induce a motion of the electrodes and thermal energy can induce mechanical deformation like expansion or shrinking of one or more elements in the device.

Furthermore, a device according to any of the embodiments described earlier may comprise at one or more additional mechanical parts or first additional layers 14 that are, each, at least partly covered by layers 24 of a fourth 2D layered material, such as to exhibit a fourth surface S4 vis-à-vis the second surface S2. As illustrated in FIG. 3 or 4, the device 100 may for instance comprise the first additional layers 14 between the gate electrode 13 and the source electrode 12. The first additional layer 14 is covered by layers of a fourth 2D layered material, i.e., exhibiting a surface S4 vis-à-vis the surface S2. The additional 2D layered material(s) makes it possible to decrease friction/stiction with additional mechanical parts that comes into contact with the second surface 22.

Clearly, two or more of the 2D layered materials evoked earlier may consist of a same 2D layered material, for ease of fabrication.

Furthermore, as illustrated in the appended drawings, one or more of the electrodes of the device 100 may be at least partly covered with layers of the 2D layered material that they comprise. For example, in the embodiments of FIGS. 1-14, the electrode bodies are covered with layers of 2D layered material. In FIGS. 15-16, some of the parts/electrodes are electrically connected to layers of 2D layered material, without being necessarily covered by them. In addition, layers of 2D layered material may partly cover a given part, while further extending beyond that part, as illustrated in FIG. 4 with the layer that cover both the drain and the insulating layer.

While the present invention has been described with reference to a limited number of embodiments, variants and the accompanying drawings, it will be understood by those skilled in the art that various changes may be made and equivalents may be substituted without departing from the scope of the present invention. In particular, a feature recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims.

In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, the straight beam shape of some of the depicted electrodes could be made more sophisticated, adopting e.g., a curved electrode shape.

What is claimed is:

1. An electromechanical switching device structure comprising:
    a first electrode having a first 2D layered material with a first surface, and the first 2D layered material is electrically conducting;
    a second electrode having a second 2D layered material with a second surface, wherein the second surface is opposite the first surface, a distance separates the first surface from the second surface, and the second 2D layered material is electrically conducting;
    an actuation mechanism, wherein at least one of the two electrodes is actuatable by the actuation mechanism changing the distance between the first surface and the second surface, the change in distance modifies the electrical conductivity transverse to each of the first surface and the second surface thereby enabling current modulation between the first electrode and the second electrode.

2. The structure of claim 1, wherein the first and second electrodes comprise a drain electrode and a source electrode, the actuation mechanism being an electromechanical actuation mechanism that comprises a gate electrode configured with respect to the at least one actuatable electrode enabling actuation thereof.

3. The structure of claim 1, wherein the actuation mechanism is actuatable to modify the distance transversely to each of the first surface and the second surface.

4. The structure of claim 1, wherein the at least one of the two electrodes is mounted movable, such as for the first and second surfaces to be movable parallel, relatively to each other, and wherein the at least one actuatable electrode is actuatable by the actuation mechanism to modify an overlap between the first surface and the second surface.

5. The structure of claim 4, wherein one or each of said two electrodes comprises an active region exhibiting an active surface, the latter being the first surface or the second surface, and wherein the active region is embedded in an inactive region exhibiting an inactive surface, the latter being the surface of an insulating material such as hexagonal boron nitride, surrounding the active surface, the active surface level with the inactive surface.

6. The structure of claim 1, wherein at least one actuatable electrode is: flexibly mounted; pivotably mounted; rotatably mounted; and/or is deformable in the device, such as for the first and second surfaces to be slidably movable relatively to each other upon actuation of the second electrode by the actuation mechanism; and
    the actuation mechanism is an electromechanical actuation mechanism that comprises a gate electrode, configured with respect to the at least one actuatable electrode to flex, pivot, rotate, and/or deform the at least one actuatable electrode upon actuation by the actuation mechanism.

7. The structure of claim 6, wherein the at least one actuatable electrode comprises a beam and an anchor, the beam flexibly and/or pivotably anchored at the anchor.

8. The structure of claim 6, wherein the at least one actuatable electrode is the second electrode, the first electrode is a drain electrode, the device further comprises a source electrode distinct from the second electrode, the source electrode and the drain electrode are arranged side-by-side in the device and preferably extend parallel to each other, and the source electrode comprises layers of a third 2D layered material that has a third surface relative to the second surface and coplanar with the first surface and wherein, the second electrode is actuatable by the actuation mechanism to modify an overlap between the second surface and the first surface of the drain electrode, while remaining in electrical contact with the source electrode, such as to modify an electrical conductivity between the first surface and the third surface via the second surface.

9. The structure of claim 6, wherein the second electrode comprises a beam and two anchors, the second electrode being coupled as a source electrode in the device, the beam anchored at each of the anchors and deformable upon actuation by the gate electrode.

10. The structure of claim 6, wherein the at least one actuatable electrode is the second electrode, the latter comprising a beam rotatably mounted in the device, exhibiting two parts extending from an axis about which the beam is rotatable, with one of the parts arranged in proximity of the gate electrode for it to be actuatable by the gate electrode, the other one of the parts comprising the second layer of the second 2D layered material.

11. The structure of claim 1, wherein the 2D layered material comprises on of: graphene, graphitic layers, BN, $MoS_2$, $WS_2$, $MoSe_2$, $NbSe_2$, $NbS_2$, $NbTe_2$, $TaS_2$, $TaSe_2$, $TaTe_2$ or $TiSe_2$.

12. The structure of claim 1, wherein the actuation mechanism comprises one or any combination of: an electrostatic mechanism; a piezoelectric mechanism; a thermal deformation mechanism; a material stress mechanism or a magnetic mechanism.

13. A structure of claim 1, wherein at least one additional mechanical part of the device is covered by layers of a fourth 2D layered material exhibiting a fourth surface relative to the second surface.

14. The structure of claim 1, wherein two or more of the 2D layered materials consist of a same 2D layered material.

15. The structure of claim 1, wherein one or more of the electrodes of the devices are at least partly covered with a layer of the 2D layered materials that they comprise.

* * * * *